United States Patent [19]

Pitt et al.

[11] Patent Number: 4,587,509
[45] Date of Patent: May 6, 1986

[54] HALL EFFECT DEVICE WITH OVERLAPPING FLUX CONCENTRATORS

[75] Inventors: Gillies D. Pitt, Saffron Walden; Philip Extance, Cambridge, both of United Kingdom

[73] Assignee: Standard Telephones & Cables, plc, London, England

[21] Appl. No.: 625,559

[22] Filed: Jun. 28, 1984

[30] Foreign Application Priority Data

Jul. 6, 1983 [GB] United Kingdom ............ 8318267

[51] Int. Cl.⁴ ............... H01L 43/00; H01L 43/02
[52] U.S. Cl. ............... 338/32 H; 324/251; 324/260; 357/27; 338/32 R; 307/308
[58] Field of Search ............ 338/32 H, 32 R; 324/235, 251, 246, 247, 252; 357/27; 428/611, 928, 632; 307/308, 309

[56] References Cited

U.S. PATENT DOCUMENTS 4,398,342  8/1983  Pitt et al. ................ 357/27

FOREIGN PATENT DOCUMENTS

| 56-90577 | 7/1981 | Japan | 338/32 R |
| 57-75476 | 5/1982 | Japan | 338/32 R |
| 0705248 | 3/1954 | United Kingdom | 357/27 |
| 0909647 | 10/1962 | United Kingdom | 357/27 |
| 1039252 | 10/1964 | United Kingdom | 357/27 |
| 1207606 | 10/1970 | United Kingdom | 357/27 |

*Primary Examiner*—Andrew J. James
*Assistant Examiner*—Charles S. Small, Jr.
*Attorney, Agent, or Firm*—Kerkam, Stowell, Kondracki & Clarke

[57] ABSTRACT

A Hall effect device for responding to weak magnetic fields uses a small chip of gallium arsenide located between the overlapped ends of two flux concentrators. The spacing between the concentrators may be as small as 95 micrometers. The flux concentrator, which serve to enhance the device's sensitivity are made of amorphous magnetic material, i.e. a metallic glass, which has high permeability.

18 Claims, 3 Drawing Figures

HALL EFFECT DEVICE WITH OVERLAPPING FLUX CONCENTRATORS

BACKGROUND OF THE INVENTION

This invention relates to Hall Effect Devices, and especially to such devices which are compact.

The ability to sense weak magnetic fields has many applications both in the civil and in the military areas, e.g. the detection of vehicles, for navigation, and for other military requirements. We have found that solid-state devices using the Hall effect used in conjunction with flux concentrator allows the detection of weak magnetic fields (10-100 gamma and below) within small volumes. The ability to shape the flux concentrator allows great flexibility. Some compact Hall effect devices in which flux concentrators are used have been described in our U.S. Pat. No. 4,398,342.

SUMMARY OF THE INVENTION

It is an object of the invention to provide Hall effect devices which are even more compact than those described in the above-mentioned application.

According to the invention, there is provided a Hall effect device which includes flux concentrators associated with the Hall element, each said flux concentrator being a thin ribbon of a magnetic material having a high permeability.

BRIEF DESCRIPTION OF THE DRAWINGS

Embodiments of the invention will now be described with reference to the drawing in which.

DETAILED DESCRIPTION OF THE DRAWINGS

The Hall effect devices to be described herein use gallium arsenide for the Hall element since it has higher mobility than silicon, and greater field sensitivity. It has a much better temperature of the Hall output voltage than the smaller band-gap materials such as indium arsenide and indium antimonide. Due to the difference in the energy band structure gallium arsenide has a lower strain sensitivity than does silicon. Further with current processing techniques it is possible to get homogeneous wafers of gallium arsenide with high yield when using standard "FET" technology.

The Hall elements are made using ion-implantation methods, and such elements have been made which have a higher carrier concentrations with lower sensitivity than for older methods. Offset voltages of such elements have been found to be very small, and the drift of the Hall voltage is also small. Further, the field sensitivity is very nearly temperature-independent, and the offset voltage changes only in a small amount and in a reproducible fashion. The Hall voltage is linear with current up to 5mA (DC, and not pulsed), and linearity is extended compared with existing devices. The size of a discrete unmounted chip, in this example, is approximately 0.625 mm × 0.625 mm × 0.4 mm. The active layer is n-type and is approximately 0.3 micrometers thick.

Figure 1:
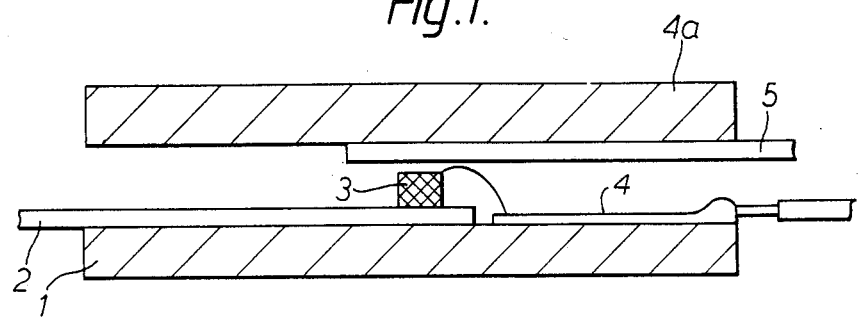
FIG. 1 is an "edge-on" view of a device embodying the invention.

In FIG. 1 we see a lower alumina substrate 1 on which one flux concentrator 2 is mounted. On the tip of this flux concentrator there is the Hall element chip 3 connected by flying leads, one of which is shown, to conductor tracks such as 4 on the lower substrate. Four such tracks are provided, each connected to one of the electrodes on the chip 3, two electrodes being for the current input and the other two being for the Hall voltage output.

There is also an upper substrate 4a, also of alumina, which carries the other flux concentrator 5.

Figure 2:
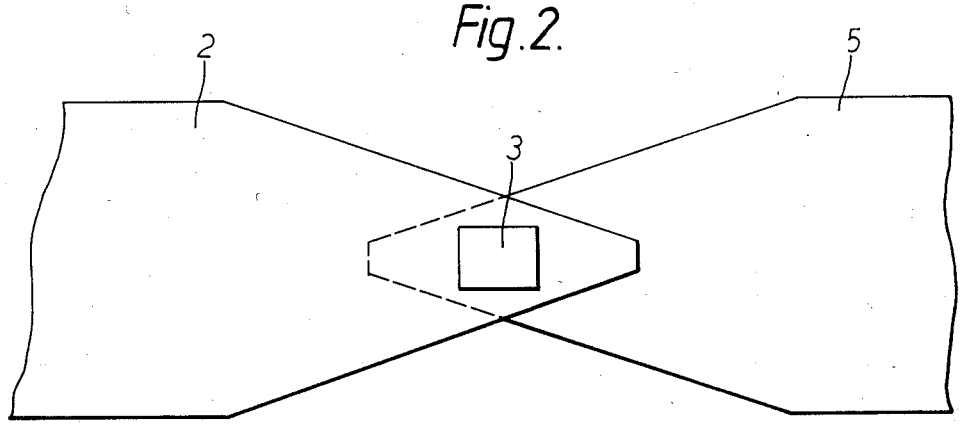
FIG. 2 is a plan view which shows the relative locations of the flux concentrators and the Hall element.

As can best be seen from the enlarged, but not to scale, representation of FIG. 2, the chip 3 is mounted on the tip of the lower flux concentrator 2 and the tips of the two flux concentrators overlap. Hence the magnetic field being sensed is concentrated in the overlapping region of the flux concentrators 2, 5, which greatly enhances the output due to the magnetic field to be sensed.

The manufacture of such devices will now be briefly described. The flux concentrator ribbon used is, in our case, that sold under the trade name "Vitrovac 6025", and it is cut to provide flux concentrators of the required shape and size. The permeability of flux concentrators made of this material can be increased by annealing. The lower concentrator 2 is bonded to an alumina substrate 1, which has previously been provided with the lead-out tracks for the Hall element, which tracks are made by deposition. The upper concentrator 5 is bonded to another alumina substrate 4a such that when assembled the tips of the flux concentrator overlap. The Hall element device is attached to the tip of the lower flux concentrator 2, but is not electrically bonded thereto and aluminum wires are used to couple the Hall element's electrodes to the lead-out tracks on the lower substrate.

The aluminum bonds thus produced are protected by a coating of a silicone resin or other insulating packaging. The two substrates are now stuck together, using a known thickness of alumina sheet as packing. Then copper wires can be soldered to the lead-out pads of the tracks for test purposes.

The response to weak fields are greatly enhanced when using flux concentrators such as described above, and the degree of enhancement depends on the length and the width of the concentrators. The effect of such concentrators is to "funnel" the flux into the chip located between the concentrator tips, and with the small dimensions offset voltage and temperature independence are reduced greatly as compared with conventional Hall sensors. These concentrators need not be flat as shown, but can be curved to suit the particular application.

The sensitivity can also be enhanced by reducing the gap in which the chip is located as far as possible, and some improvement is possible by lapping or etching the gallium arsenide chip, and reducing the thickness of the alumina spacers placed between the substrates when a device is assembled.

The wafers from which the gallium arsenide chips are produced are processed as follows:

(a) ion implantation produces a thin active layer and the water is annealed at 850° C.

(b) ohmic contacts are made by evaporating Au-Ge-Ni alloy, approximately 1500 angstroms thick, onto the layer, and alloying this with the gallium arsenide by heating to 450° C.

(c) proton isolation is used to define the active area of the device.

(d) gold is evaporated on to the contact areas to give low resistivity metallisation, approximately 5000 angstrom thick.

(e) a polyimide scratch resistant layer is deposited over the wafer leaving the gold pads clear.

The individual elements are separated from the two-inch diameter wafer by scribing and breaking.

The flux concentrators used in the present arrangements use amorphous metal ribbon, produced commercially by Vacuumschmelze GmbH, which has a very high permeability, but is less sensitive to shock and stress than Mumetal. The ribbon is available in various sizes, one of which is about 12 mm wide and 40 micrometers thick. Flux concentrators of such material with tapered ends arre bonded above and below a GaAs Hall effect element to which electrical connections are made by untrasonically bonded aluminum wires to thick film printed conductive tracks on alumina substrates, as shown in FIG. 1. The bond wires are protected by encapsulation in a silicone resin.

The gap between the overlapped ends of the flux concentrator should be as small as possible, and this gap can be reduced by lapping the gallium arsenide Hall element, which can reduce the gap to 95 micrometers or less, and by optimisation of the bonding and encapsulation procedures.

Various applications of such devices will now be considered. One application is to mine fuses, in which case a magnetic sensor capable of responding to fields down to 1000 gamma can be readily incorporated into a mine. Such a mine would then be an effective anti-vehicle mine. Suitable shaping for the flux concentrator can give the device directionality.

Figure 3:
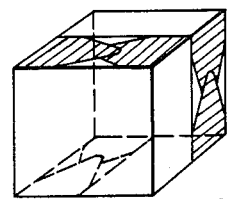
FIG. 3 shows one way of using three Hall effect devices such as in FIGS. 1 and 2 in a three-dimensional assembly.

Various three axis devices based on magnetometers are possible, some of which exploit the fact that flexible flux concentrators can be used to "funnel in" the magnetic field from several directions. Thus some three-axis devices may consist of a stack of Hall elements, but with the concentrators pointing in three directions. Alternatively, the devices can be on three faces of a cube, as shown in FIG. 3.

For dealing with armoured fighting vehicles in a relatively cheap way, a magnetic sensor using a device such as that of FIGS. 1 and 2 can be provided in a free-flight rocket for "top attack". Here a change of magnetic field sensed as the target is crossed is used to detonate the charge at the optimum, time. For this application, a frequency response up to at least 1 KHz is needed.

For a moving vehicle detector, the speed of the vehicle is measured by using two matched magnetic sensors separated by a small distance.

The versatility of the metallic glass flux concentrator can be used to advantage by incorporating them as magnetic field guides into the design of the housing. Extended flux concentrators will also increase the sensitivity of the device.

The frequency response of the devices described herein is flat to over 10 KHz, which is better than flux gates. The response can be improved by etching and polishing the flux concentrators to eliminate surface effects. Such a good high frequency response is useful where the devices are used for velocity measurement.

Although the devices described use gallium arsenide it will be appreciated that other materials such as silicon, indium arsenide, indium antimonide and gallium aluminium arsenide can be used.

What is claimed is:

1. A Hall effect device comprising a first flux concentrator comprising a thin ribbon of magnetic material having a high permeability and a tapered end portion;
   a second flux concentrator comprising a thin ribbon of a magnetic material having a high permeability and a tapered end portion;
   a Hall element;
   said tapered end portions of said first and second flux concentrators overlapping each other, and said Hall element being positioned between said first and second flux concentrators where they overlap.

2. A Hall effect device in accordance with claim 1 wherein said magnetic material comprises an amorphous metallic glass.

3. A Hall effect device in accordance with claim 1 wherein said Hall element is a gallium arsenide device.

4. A Hall effect device in accordance with claim 1 wherein;
   said first flux concentrator is bonded to a first alumina substrate;
   and said second flux concentrator is bonded to a second alumina substrate.

5. A Hall effect device in accordance with claim 1 wherein;
   said first and second flux concentrators are oriented in alignment with a first axis; and further comprising:
   third and fourth flux concentrators each comprising a thin ribbon of said magnetic material and each having a tapered end portion;
   a second Hall element;
   said tapered end portions of said third and fourth flux concentrators overlapping each other, said second Hall element being positioned between said third and fourth flux concentrators where they overlap;
   said third and fourth flux concentrators being oriented in alignment with a second axis.

6. A Hall effect device in accordance with claim 5 wherein said first axis is perpendicular to said second axis.

7. A Hall effect device in accordance with claim 5 wherein said Hall element and said second Hall element are gallium arsenide devices.

8. A Hall effect device in accordance with claim 5 comprising:
   a fifth and sixth flux concentrator each comprising a thin ribbon of said magnetic material and each having a tapered end portion;
   a third Hall element;
   said tapered end portions of said fifth and sixth flux concentrators overlapping each other, said third Hall element being positioned between said fifth and sixth flux concentrators where they overlap;
   said fifth and sixth concentrators being oriented in alignment with a third axis.

9. A Hall effect device in accordance with claim 8 wherein said first axis is perpendicular to said second axis.

10. A Hall effect device in accordance with claim 9 wherein said third axis is perpendicular to said first and second axes.

11. A Hall effect device in accordance with claim 8 wherein said Hall element, said second Hall element and said third Hall element are gallium arsenide devices.

12. A Hall effect device in accordance with claim 5 wherein said magnetic material comprises an amorphous metallic glass.

13. A Hall effect device in accordance with claim 7 wherein said magnetic material ccomprises an amorphous metallic glass.

14. A Hall effect device in accordance with claim 8 wherein said magnetic material comprises an amorphous metallic glass.

15. A Hall effect device comprising:
 a Hall element; and
 a plurality of flux concentrators associated with said Hall element, each of said flux concentrators comprising a thin ribbon of a magnetic material having a high permeability,
 said magnetic material being an amorphous metallic glass; and
 each of said flux concentrators having a tapered end portion, the end portions of the flux concentrators overlapping said Hall element; and
 said Hall element being positioned between said overlapping end portions.

16. A Hall effect device in accordance with claim 15 wherein each of said flux concentrators is bonded to an alumina substrate.

17. A Hall effect device in accordance with claim 15 wherein said Hall element is a gallium arsenide device.

18. A Hall effect device comprising:
 a Hall element formed by a relatively thin plate of a semiconductor material incorporated into a chip having a thickness of 0.5 mm or less; and
 two flux concentrators associated with said Hall element, each said flux concentrator comprising a thin ribbon of a high permeability magnetic material, wherein
 each said flux concentrator has its end portion tapered in plan to a narrow blunt end;
 the two end portions of the flux concentrator overlap with the Hall element located between the narrow end portions and bonded to one of the flux concentrators; and
 the flux concentrators are as closely spaced as is compatible with the accommodation between them of the chip incorporating the Hall element, the arrangement being such that magnetic flux is guided by the concentrators from the wider portions thereof to the narrow portions and thus to the Hall element.

* * * * *